United States Patent
Joo et al.

(10) Patent No.: US 8,541,800 B2
(45) Date of Patent: Sep. 24, 2013

(54) LIGHT EMITTING DEVICE PACKAGE, BACKLIGHT UNIT, DISPLAY DEVICE AND LIGHTING DEVICE

(75) Inventors: Seong Ah Joo, Suwon (KR); Hyo Jin Lee, Seoul (KR); Il Woo Park, Suwon (KR); Kyung Tae Kim, Hwaseong (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 61 days.

(21) Appl. No.: 13/140,652

(22) PCT Filed: Dec. 21, 2009

(86) PCT No.: PCT/KR2009/007644
§ 371 (c)(1),
(2), (4) Date: Jun. 17, 2011

(87) PCT Pub. No.: WO2010/071386
PCT Pub. Date: Jun. 24, 2010

(65) Prior Publication Data
US 2011/0249424 A1  Oct. 13, 2011

(30) Foreign Application Priority Data

Dec. 19, 2008 (KR) .................. 10-2008-0130053
Dec. 21, 2009 (KR) .................. 10-2009-0127737

(51) Int. Cl.
*H01L 33/00* (2010.01)

(52) U.S. Cl.
USPC ............. 257/98; 257/100; 257/99; 362/84; 362/231; 362/800

(58) Field of Classification Search
USPC ............ 257/98, 100, 99, 81, 82, 91, E33.056; 362/231, 84, 97.1, 97.2, 97.3, 800
See application file for complete search history.

(56) References Cited

U.S. PATENT DOCUMENTS

| | | |
|---|---|---|
| 2007/0090389 A1 | 4/2007 | Liu et al. |
| 2007/0138484 A1 | 6/2007 | Yamamoto et al. |
| 2008/0012036 A1 | 1/2008 | Loh et al. |
| 2008/0029775 A1* | 2/2008 | Liu et al. .................. 257/98 |
| 2008/0054286 A1* | 3/2008 | Loh et al. .................. 257/98 |

FOREIGN PATENT DOCUMENTS

| | | |
|---|---|---|
| CN | 2717025 Y | 8/2005 |
| KR | 10-2006-0093069 A | 8/2006 |
| KR | 10-2006-0135848 A | 12/2006 |
| KR | 10-2007-0045462 A | 5/2007 |

OTHER PUBLICATIONS

International Search Report for PCT/KR2009/007644 issued Jul. 27, 2010 [PCT/ISA/210].
Extended Search Report issued May 3, 2012 by the European Patent Office in counterpart European Application No. 09833664.7.

(Continued)

*Primary Examiner* — Ali Alavi
(74) *Attorney, Agent, or Firm* — Sughrue Mion, PLLC

(57) ABSTRACT

There is provided a light emitting device package including: a package body providing a chip mounting area and including first and second lead terminals; an LED chip mounted on the chip mounting area and electrically connected to the first and second lead terminals; a groove portion disposed around the LED chip in the chip mounting area; and a wavelength conversion portion formed of a resin containing a wavelength conversion material with which to enclose the LED chip and having an outer shape defined by the groove portion.

28 Claims, 9 Drawing Sheets

(56) References Cited

OTHER PUBLICATIONS

Communication dated Jan. 21, 2013, issued by the State Intellectual Property Office of the P.R.C. in counterpart Chinese Application No. 200980151098.8.

Communication dated Jun. 7, 2013, issued by the State Intellectual Property Office of P.R. China in counterpart Chinese Application No. 200980151098.8.

* cited by examiner (a)

(b)

(a)

(b)

LIGHT EMITTING DEVICE PACKAGE, BACKLIGHT UNIT, DISPLAY DEVICE AND LIGHTING DEVICE

TECHNICAL FIELD

The present invention relates to a light emitting device package, and more particularly, to a wavelength-converted light emitting device package having a resin package portion containing a wavelength conversion material, and a backlight unit (BLU), a display device and an illumination device using the light emitting device package.

BACKGROUND ART

A light emitting diode (LED) is a semiconductor device converting electrical energy into light energy. The LED is formed of a compound semiconductor producing light of a specific wavelength according to an energy band gap. The usage of LEDs is increasingly being expanded into the areas of optical communications, a mobile display, a display for a computer monitor and the like, a backlight unit (BLU) for a liquid crystal display (LCD), and an illumination device.

Particularly, the development of LEDs for an illumination device requires high current, high flux, and uniform light emission, thereby leading to a demand for developing a new design and process.

Conventionally, in order to emit white light, a light emitting device package has been usually manufactured by applying a compound of a wavelength conversion material such as a phosphor and a transparent resin around an LED chip using a known method such as dispensing. In this case, there is a difference in the amount of wavelength conversion materials positioned on the upper and side surfaces of the LED chip, thereby causing a difference in color characteristics such as color temperature between the white light emitted from the upper surface of the LED chip and the white light emitted from the side surface of the LED chip.

That is, as shown in FIG. 1, the difference in color characteristics such as color temperature leads to the formation of a circular band X called a bull's eye during light emission, thereby causing non-uniform white light emitting characteristics throughout the entirety of the light emitting device package.

Also, when an LED chip mounting area has a cup structure with resin filling the inside of the cup structure, an optical path is extended due to diffusion induced by a wavelength conversion material such as a phosphor, whereby optical efficiency is reduced.

DISCLOSURE

Technical Problem

An aspect of the present invention provides a light emitting device package capable of emitting uniform white light by increasing the light efficiency thereof and avoiding a difference in color characteristics such as color temperature according to light emitting area.

An aspect of the present invention also provides a light source module and a backlight unit including the light emitting device package.

An aspect of the present invention also provides a display device and an illumination device including the light emitting device package.

Technical Solution

According to an aspect of the present invention, there is provided a light emitting device package including: a package body providing a chip mounting area and including first and second lead terminals; an LED chip mounted on the chip mounting area and electrically connected to the first and second lead terminals; a groove portion disposed around the LED chip in the chip mounting area; and a wavelength conversion portion formed of a resin containing a wavelength conversion material with which to enclose the LED chip and having an outer shape defined by the groove portion.

The wavelength conversion material may include a phosphor, a quantum dot or a mixture thereof.

The phosphor may include a silicate-based phosphor, an oxide-based phosphor, a nitride-based phosphor, a garnet-based phosphor, a sulfide-based phosphor or a combination thereof.

The quantum dot may include a semiconductor nanocrystal including a group II-VI compound such as CdS, CdSe, CdTe, ZnS, ZnSe, ZnTe, HgS, HgSe and HgTe, a semiconductor nanocrystal including a group III-V compound such as GaN, GaP, GaAs, InP and InAs, or a mixture thereof.

The wavelength conversion material may include a mixture of a phosphor and a quantum dot. For example, the wavelength conversion material may include a mixture of yellow and green phosphors and a red light emitting quantum dot.

The groove portion may have a circular shape to enclose the LED chip.

The groove portion may have a shape corresponding to an outer shape of the LED chip. For example, when the outer shape of the LED chip is polygonal, the groove portion may have a polygonal shape to enclose the LED chip.

The outer shape of the LED chip may be quadrangular, and the groove portion may have a quadrangular shape to enclose the LED chip.

The LED chip may be mounted on an upper surface of one of the first and second lead terminals. In this case, the groove portion may be formed in the upper surface of the lead terminal having the LED chip mounted thereon. As desired, the lead terminal having the LED chip mounted thereon may have a heat sink extended downwards.

The groove portion may be formed in a surface of the package body other than the lead terminal.

For example, the package body may include a ceramic substrate providing the chip mounting area, and at least a portion of the groove portion may be disposed in the ceramic substrate.

When the groove portion is defined as a first groove portion, the light emitting device package may further include a second groove portion disposed in the chip mounting area and uniformly spaced apart from the first groove portion while enclosing the first groove portion.

When a wavelength conversion portion disposed along the first groove portion is defined as a first wavelength conversion portion, the light emitting device package may further include a second wavelength conversion portion disposed above the first wavelength conversion portion and defined by the second groove portion.

The first and second wavelength conversion portions may include different wavelength conversion materials emitting light of different wavelengths. The wavelength conversion material of the first wavelength conversion portion may produce light having a wavelength shorter than that of light produced by the wavelength conversion material of the second wavelength conversion portion.

The groove portion may have a vertical cross section in a V-shaped, U-shaped, or quadrangular form. The groove portion may be formed by an imprinting or etching process.

An area enclosed by the groove portion may be set to be nine times or less an area of the LED chip.

A length of a temporary straight line connecting a center of the LED chip to a point of the groove portion may be set to be three times or less a length of the LED chip from the center of the LED chip to a point of an edge of the LED chip on which the straight line passes.

A maximum height of the wavelength conversion portion maybe set to be four times or less a thickness of the LED chip.

The LED chip may be connected to at least one of the first and second lead terminals by a wire, and a height of the wire may be greater than a maximum height of a resin package portion.

According to another aspect of the present invention, there is provided a light source module and a backlight unit including the light emitting device package.

According to another aspect of the present invention, there is provided a display device and an illumination device including the light emitting device package.

Advantageous Effects

According to exemplary embodiments of the invention, a wavelength conversion portion having a relatively uniform thickness may be easily formed around an LED chip without dependence on a conventional cup structure or other molds. Particularly, the shape and/or size of a groove portion and the shape and/or size of the chip are set to be appropriately taken into consideration, thereby guaranteeing an optical path length to be most uniform in every direction and greatly enhancing luminous efficiency.

DESCRIPTION OF THE DRAWINGS

The patent or application file contains at least one drawing executed in color. Copies of this patent or patent application publication with color drawing(s) will be provided by the Office upon request and payment of the necessary fee.

MODE FOR INVENTION

Figure 1:
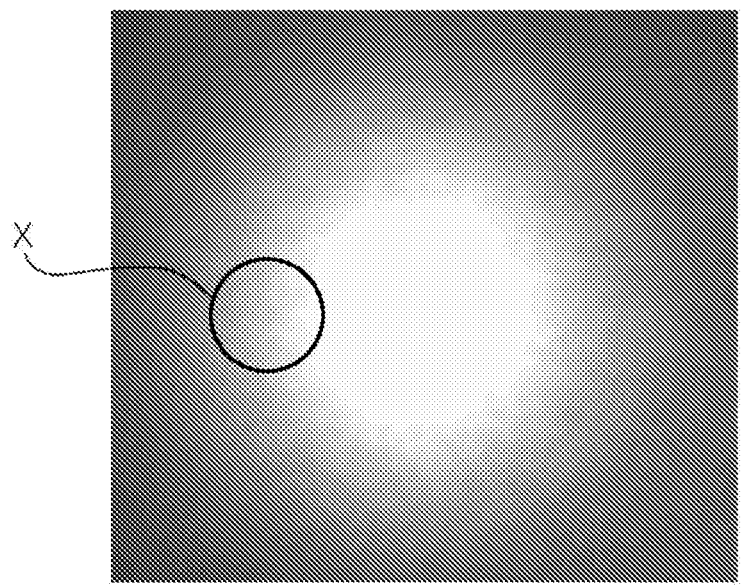
FIG. 1 is an image illustrating a state of light output from a light emitting device package according to the related art.

Exemplary embodiments of the present invention will now be described in detail with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. It should be considered that the shapes and dimensions of elements in the drawings may be exaggerated or reduced for convenience of explanation.

Figure 2:
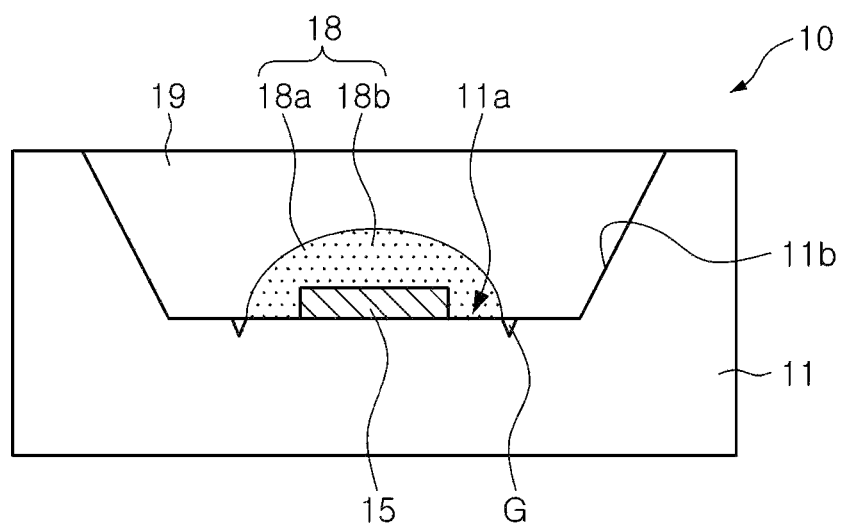
FIG. 2 is a side cross-sectional view illustrating a light emitting device package according to an exemplary embodiment of the present invention.
Figure 3:
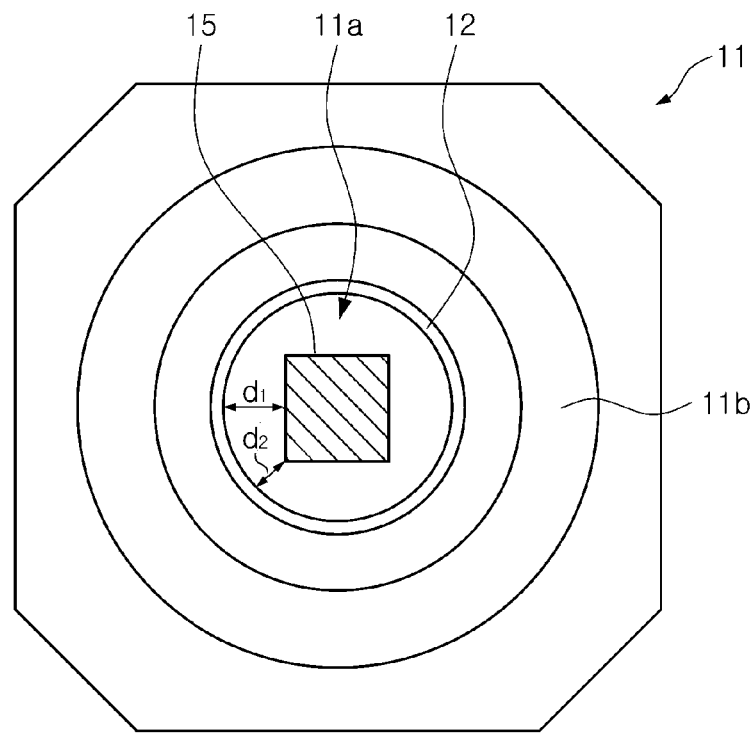
FIG. 3 is a top plan view illustrating the light emitting device package of FIG. 2.

FIG. 2 is a side cross-sectional view illustrating a light emitting device package according to an exemplary embodiment of the present invention. FIG. 3 is a top plan view illustrating the light emitting device package of FIG. 2.

As shown in FIG. 2, a light emitting device package 10 has a package body 11 in which a chip mounting area 11a is provided. An LED chip 15 is mounted on the chip mounting area 11a.

Although not shown in FIG. 2, the package body 11 has a lead terminal (not shown) electrically connected to the LED chip 15. The LED chip 15 may be electrically connected to the lead terminal by flip chip bonding or a wire according to the electrode structure thereof.

According to this embodiment, the package body 11 may include a sidewall structure 11b enclosing the chip mounting area 11a. The sidewall structure 11b may have a sloping inner wall that may be used as a reflective surface.

The light emitting device package 10 includes a wavelength conversion portion 18 formed of a resin 18a containing a wavelength conversion material 18b with which to enclose the LED chip 15. The wavelength conversion material 18b may include a phosphor, a quantum dot or a mixture thereof. Generally, the wavelength conversion material 18b maybe formed such that it produces white light by mixing each wavelength of emitted light obtained according to emission wavelength of the LED chip 15.

For example, when the LED chip 15 emits blue light, the wavelength conversion material 18b enclosing the LED chip 15 may include a combination of green and red phosphors or quantum dots, or additionally include a yellow or orange phosphor or quantum dot.

The green phosphor may be a silicate-based phosphor including $M_2SiO_4$:R or a nitride-based phosphor including β-SiAlON. The red phosphor may be a nitride-based phosphor including $CaAlSiN_3$:R, $M_xSi_yN_{(2/3x+4/3y)}$:R or $M_xSi_yO_zN_{(2/3x+4/3y-2/3z)}$:R. Here, M is at least one selected from group II elements consisting of Mg, Ca, Sr, Ba and Zn, and R is at least one selected from rare earth elements.

The phosphors are not limited thereto. Phosphors used for the wavelength conversion material may be a silicate-based phosphor such as (Ba, Sr, Ca, Mg)$_2$, $SiO_4$:Eu or (Ba, Sr, Ca, Mg)$_3SiO_5$:Eu, an oxide-based phosphor such as (Ba, Sr, Ca, Mg) (Sc, Y, Gd, La, Lu, Al, In)$_2O_4$:Ce, a nitride-based phosphor such as (Ba, Sr, Ca, Mg) (Al, Si, Ga, In)ON:Eu, α-SiAlON:Eu or β-SiAlON:Eu, a garnet-based phosphor such as (Y, Tb)$_3$(Al, Ga)5O$_{12}$:Ce, a sulfide-based phosphor such as (Sr, Ca, Ba, Mg) (S, Se, Te):Eu or a combination thereof.

The quantum dot may be a semiconductor nanocrystal including a group II-VI compound such as CdS, CdSe, CdTe, ZnS, ZnSe, ZnTe, HgS, HgSe and HgTe, a semiconductor nanocrystal including a group III-V compound such as GaN, GaP, GaAs, InP and InAs, or a mixture thereof.

As desired, the wavelength conversion material may be a combination of a phosphor and a quantum dot. For example, a red light emitting quantum dot, instead of a red phosphor with relatively low light efficiency, maybe combined with a yellow or green phosphor.

Also, the resin 18b may be an epoxy resin, a silicon resin, a mixture thereof, or a compound thereof.

The area for forming the wavelength conversion portion 18 is defined by a groove portion G that is formed in the chip mounting area 11a. The groove portion G adopted in this embodiment may define an outer boundary of a liquid resin containing a wavelength conversion material that is provided for the wavelength conversion portion 18 and have a convex structure through surface tension. This liquid resin of convex structure, containing the wavelength conversion material, may be provided as the wavelength conversion portion 18 through a curing process.

In this manner, the outer shape of the wavelength conversion portion 18 is defined by the groove portion G, and thus the wavelength conversion portion 18 may have a convex structure. The shape of the wavelength conversion portion 18 maybe determined mainly by the groove portion G, but be variably regulated by the viscosity of the liquid resin, surface characteristics (e.g., roughness, hydrophobic/hydrophilic properties), wavelength conversion material content, additive type and content or the like.

Also, since the wavelength conversion portion 18 is defined by the groove portion G formed around the LED chip 15, as compared with a case defined by a cup structure providing a chip mounting area, a variation in thickness determining an optical path length in every direction may be reduced.

Accordingly, a bull's eye phenomenon, caused by a color temperature difference at the edge of the wavelength conversion portion 18 at which the optical path length is relatively long, may be resolved, whereby white light having uniform color temperature may be output.

Particularly, the average optical path length is significantly reduced throughout the entirety of the wavelength conversion portion, thereby reducing optical loss induced by diffusion. In this manner, it is considered that the wavelength conversion portion 18 guarantees a minimum optical path length for a desired wavelength conversion and has a thickness reduced to be within a range appropriate for the wavelength conversion.

Preferably, the area in which the wavelength conversion portion 18 is formed, i.e., the area of the groove portion G may be limited to be as small as possible, and this area may be represented by a relative ratio to an LED chip area.

Specifically, the area of the wavelength conversion portion 18 may be set to be nine times or less that of the LED chip. Meanwhile, a preferable condition may be represented in another aspect. A detailed description thereof will be described with reference to FIG. 6 later.

The groove portion G adopted in this embodiment may have a circular shape in the bottom surface of the chip mounting area 11a as shown in FIG. 3 (here, the wavelength conversion portion 18 is not shown in FIG. 3.), but it is not limited thereto. This groove portion G may be formed by a known process such as an imprinting, molding or etching process.

The groove portion G may be formed on the bottom surface of the package body 11, the lead terminal, or from the bottom surface of the package body 11 through the lead terminal. The package body 11 includes a substrate in which the chip mounting area is provided. Such a substrate is formed of a ceramic material or a synthetic resin.

For example, when a ceramic substrate is desired to be employed, the forming of a groove portion G in a green sheet through an imprinting process and the sintering thereof are performed to thereby obtain a ceramic substrate having the groove portion G.

According to this embodiment, the light emitting device package 10 may further include a resin molding portion 19 formed of a transparent resin such as an epoxy resin, a silicon resin, a mixture thereof or a compound thereof. However, it is possible not to employ the resin molding portion 19. Otherwise, a lens structure combined with the resin molding portion 19 may be installed on the top of the package body.

Figure 4:
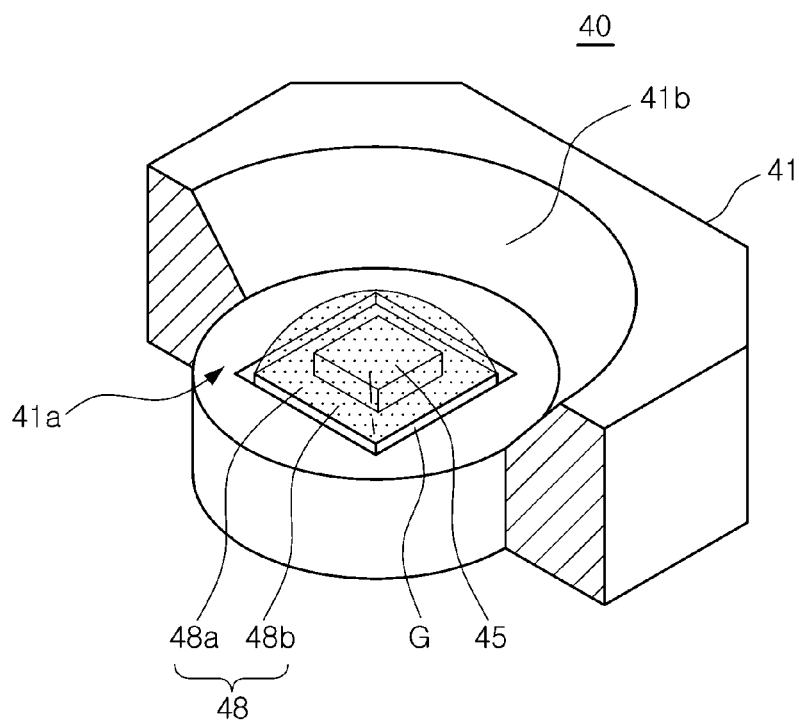
FIG. 4 is a partially cutaway perspective view illustrating a light emitting device package according to another exemplary embodiment of the present invention.
Figure 5:
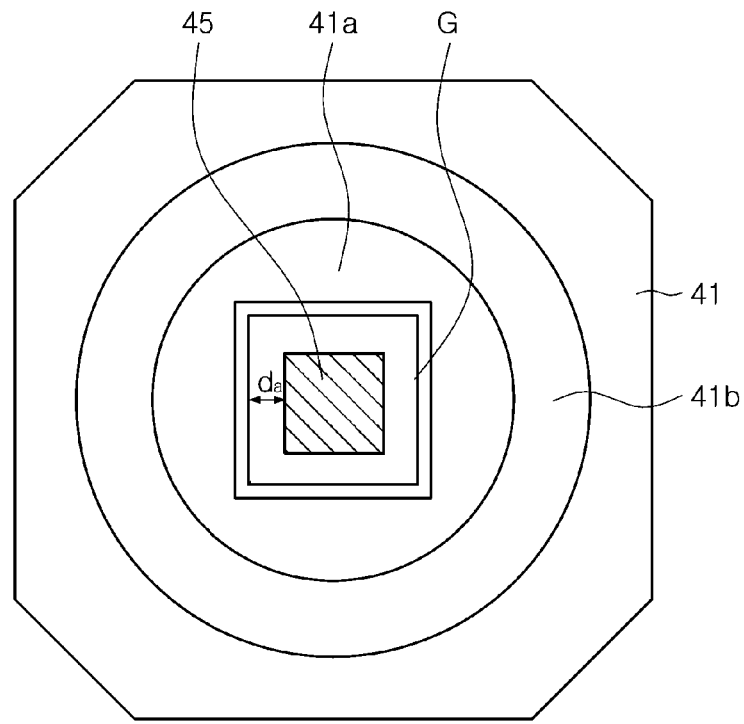
FIG. 5 is a top plan view illustrating the light emitting device package of FIG. 4.

FIG. 4 is a partially cutaway perspective view illustrating a light emitting device package according to another exemplary embodiment of the present invention. FIG. 5 is a top plan view illustrating the light emitting device package of FIG. 4.

As shown in FIG. 4, a light emitting device package 40 has a package body 41 in which a chip mounting area 41a is provided.

Similar to the embodiment shown in FIG. 2, the chip mounting area 41a has an LED chip 45 mounted thereon. The package body 41 may include a sidewall structure 41b enclosing the chip mounting area 41a. The package body 41 includes a wavelength conversion portion 48 around the LED chip 45, in which the wavelength conversion portion 48 is formed of a resin 48a containing a wavelength conversion material 48b.

According to this embodiment, a groove portion G defining the area for forming the wavelength conversion portion 48 has a quadrangular shape corresponding to the outer shape of the LED chip 45. The groove portion G having a shape corresponding to that of the LED chip 45 allows for thickness distribution in order that the wavelength conversion portion 48 formed around the LED chip 45 can have a more uniform optical path length, whereby the effect of conformal coating may be expected.

Specifically, the groove portion G having the circular shape and the LED chip 15 having the quadrangular shape as shown in FIG. 3 have a non-uniform space ($d_1 > d_2$) therebetween according to the position of each side of the LED chip 15, whereas the LED chip 45 disposed at the center of the groove portion G having the quadrangular shape according to this embodiment may have a uniform space ($d_a$) therebetween at each side.

In this embodiment, the space is relatively great at the corners of the groove portion G having the quadrangular shape, but the entire surface of the convex wavelength conversion portion 48 tends to have a uniform surface curvature due to surface tension, whereby the wavelength conversion portion 48 may have a thickness at the corner of the groove portion similar to that at both adjacent sides. Therefore, the wavelength conversion portion 48 adopted in this embodiment relieves a variation in an optical path length throughout the entirety of the wavelength conversion portion 48 as compared with the wavelength conversion portion 18 shown in FIG. 3, whereby more uniform color characteristics may be expected.

Such a groove portion structure is not limited to the quadrangular shape. The shape of the groove portion maybe made to correspond to another outer shape of an LED chip, thereby expecting a similar effect as described above.

For example, when a chip having a polygonal shape is used, a groove portion having a polygonal shape is provided so as to correspond to the polygonal shape of the chip and have a uniform space from the chip at each side, thereby providing a wavelength conversion portion having a more uniform optical path length.

Figure 6:
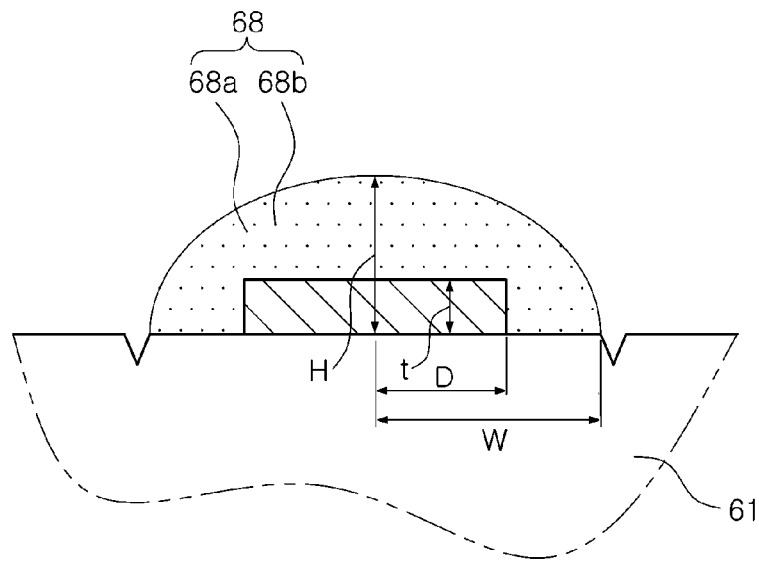
FIG. 6 is a side cross-sectional view illustrating a preferable condition with regard to the shape of a wavelength conversion portion adopted in the present invention.

FIG. 6 is a side cross-sectional view illustrating a preferable condition with regard to the shape of a wavelength conversion portion adopted in the present invention.

As described above, considering the present invention from another point of view, it is considered a method of reducing the average optical path length throughout the entirety of a wavelength conversion portion to thereby reduce optical loss induced by diffusion. This method allows the wavelength conversion portion to guarantee a minimum optical path length for a desired wavelength conversion and have a thickness reduced to be within a range appropriate for the wavelength conversion.

This method first considers limiting the area for forming a wavelength conversion portion 68, i.e., the area of a groove portion G. In another way, A length W of a temporary straight line connecting the center of the LED chip to a point of the groove portion G may be set to be three times or less a length D of the LED chip from the center of the LED chip to a point of the edge of the LED chip on which the straight line passes.

In a specific embodiment, under a minimum condition for forming the wavelength conversion portion 68 as desired, the length W of the temporary straight line connecting the center of the LED chip to one point of the groove portion G may be set to be 1.5 times, or preferably twice, the length D of the LED chip from the center of the LED chip to one point of the edge of the LED chip on which the straight line passes.

Likewise, a condition for a height of the wavelength conversion portion 68 maybe appropriately set. A maximum height H of the wavelength conversion portion 68 may be set to be four times or less a thickness t of the LED chip. Under a minimum condition for forming the wavelength conversion portion 68 as desired, the maximum height H of the wavelength conversion portion 68 may be set to be 1.5 times, or preferably twice, the thickness t of the LED chip.

Figure 7:
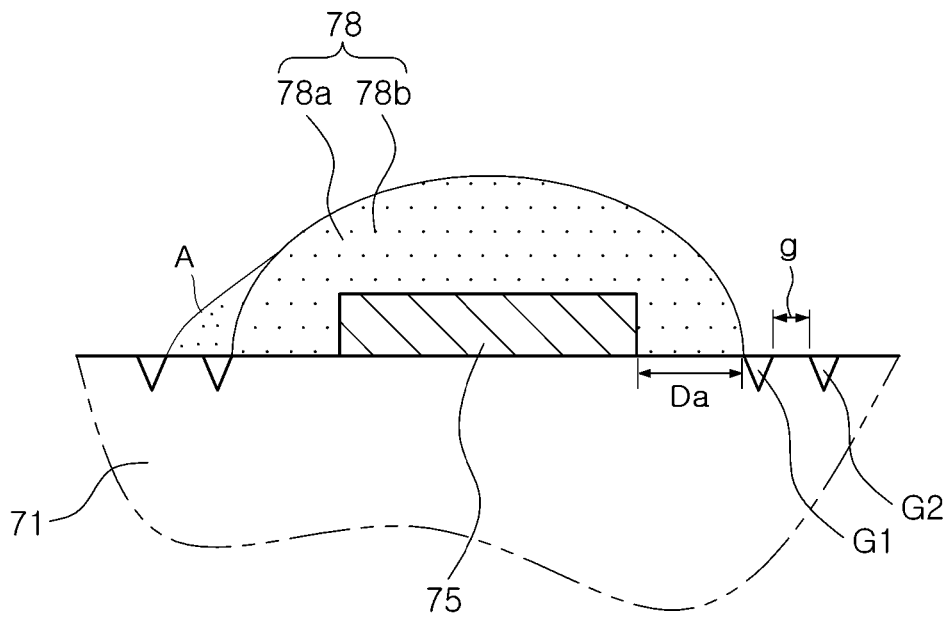
FIGS. 7A and 7B are side cross-sectional views illustrating the modification of a groove portion for forming a wavelength conversion portion adopted in the present invention.
Figure 7:
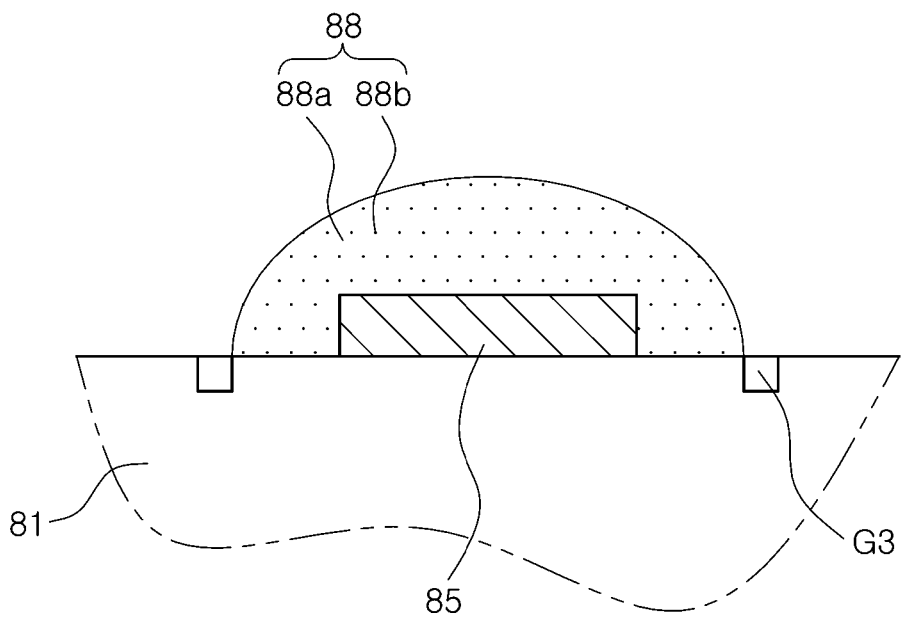

The structure of the groove portion adopted in the present invention may be variably modified. FIGS. 7A and 7B show the modification of a groove portion for forming a wavelength conversion portion adopted in the present invention.

A groove portion as shown in FIG. 7A has a dual structure including a first groove portion G1 enclosing an LED chip 75 mounted on a substrate 71 and a second groove portion G2 uniformly spaced apart from the first groove portion G1 and enclosing the first groove portion G1. Here, the second groove portion G2 is provided as a sub-groove portion.

That is, the area for forming a wavelength conversion portion 78 may be defined by the first groove portion G1, but it may be partially extended beyond the first groove portion G1 according to conditions such as the viscosity of a liquid resin containing a wavelength conversion material or a working environment.

According to this embodiment, a liquid resin A flowing over the first groove portion G1 may be blocked by the second groove portion G2. In this manner, even though the area for forming the wavelength conversion portion 78 is beyond the first groove portion G1, it may be limited by the second groove portion G2. Accordingly, the wavelength conversion portion 78 may be realized without a great error with regard to the forming area therefor.

In order to reduce the occurrence of errors, a space g between the first groove portion G1 and the second groove portion G2 may be set to be 0.2 times or less a distance Da from the edge of the LED chip to the first groove portion G1.

The groove portion according to this embodiment has the dual structure, but an additional sub-groove portion may be provided as desired. That is, a plurality of sub-groove portions may be provided.

Also, the groove portion adopted in the present invention may have a variety of cross sectional shapes. In the aforementioned embodiments, the groove portion has a V-shaped structure advantageous to the imprinting process. However, the groove portion may be in a variety of shapes such as quadrangular or curved shape.

For example, as shown in FIG. 7B, a groove portion G3 having a cross section of quadrangular shape may be formed on a substrate 81 on which an LED chip 85 is mounted, thereby using the groove portion G3 to define the area for forming a wavelength conversion portion 88.

Figure 8:
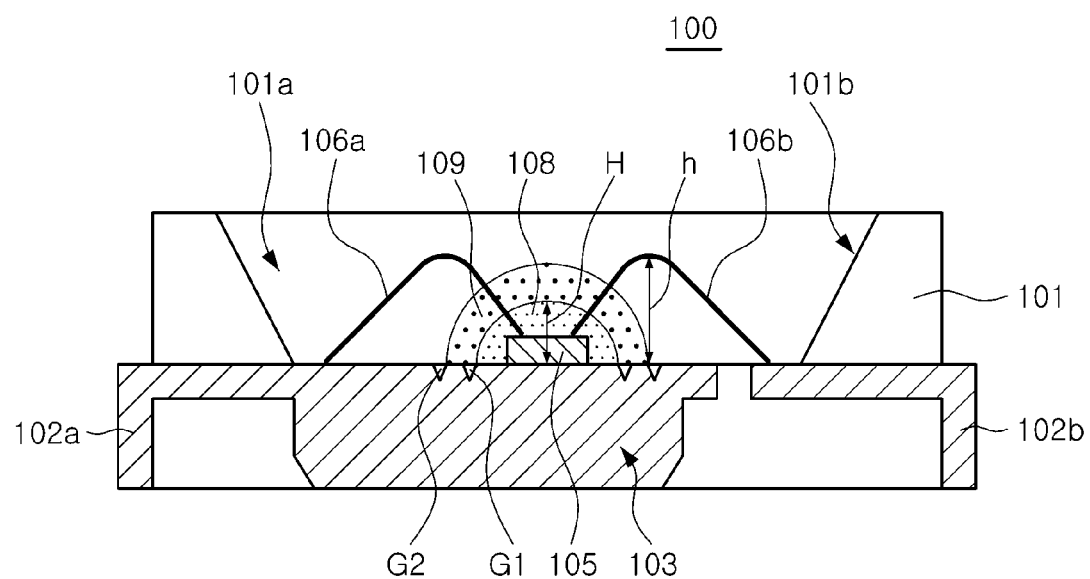
FIG. 8 is a side cross-sectional view illustrating a light emitting device package according to another exemplary embodiment of the present invention.
Figure 9:
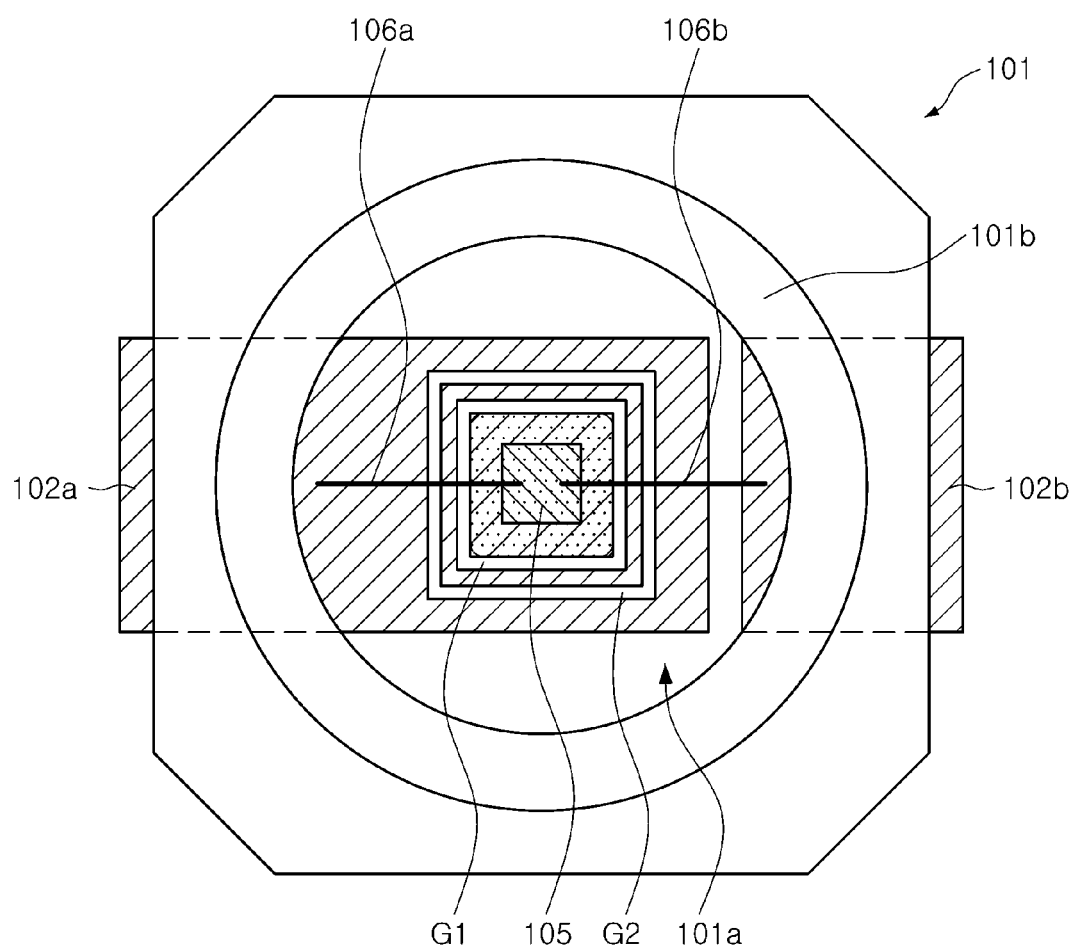
FIG. 9 is a top plan view illustrating the light emitting device package of FIG. 8.

A preferable exemplary embodiment of the present invention is shown in FIGS. 8 and 9. Here, a position at which a groove portion is formed and a wire bonding with reference to a lead terminal structure are described in detail.

As shown in FIG. 8, a light emitting device package 100 has a package body 101 in which a chip mounting area 101a is provided. The chip mounting area 101a has an LED chip 105 mounted thereon.

The package body 101 may include a sidewall structure 101b enclosing the chip mounting area 101a. The sidewall structure 101b may have a sloping inner wall that may be used as a reflective surface.

The package body 101 adopted in this embodiment includes first and second lead terminals 102a and 102b electrically connected to the LED chip 105. A heat sink 103 is disposed to correspond to the area on which the LED chip 105 is mounted in the lower portion of the first lead terminal 102a.

As shown in FIG. 8, the LED chip 105 is mounted on the upper surface of the first lead terminal 102a and is connected to the first and second lead terminals 102a and 102b by wires 106a and 106b, respectively.

Wavelength conversion portions 108 and 109 adopted in this embodiment may have a double layer structure. For this double layer structure, the aforementioned additional sub-groove portions maybe utilized. That is, as shown in FIGS. 8 and 9, two groove portions G1 and G2 uniformly spaced apart from each other may be formed such that the first groove portion G1 positioned inside is used to form the first wavelength conversion portion 108 and the second groove portion G2 positioned outside is used to form the second wavelength conversion portion 109, thereby providing desired wavelength conversion portions having a double layer structure.

As described above, the structure of a plurality of groove portions in this embodiment may have the same center unlike the embodiment of FIG. 7A, thereby being used for forming two wavelength conversion layers.

Each of the wavelength conversion portions 108 and 109 may be formed of a resin containing different wavelength conversion materials. For example, the first wavelength conversion portion 108 positioned inside may include a relatively short-wavelength phosphor or quantum dot, whereas the second wavelength conversion portion 109 positioned outside may include a relatively long-wavelength phosphor or quantum dot.

In a specific embodiment, the first wavelength conversion portion 108 may be a resin layer formed of a mixture of green and blue phosphors. The second wavelength conversion portion 109 maybe a red phosphor or a red light emitting quantum dot.

In this exemplary embodiment, two wavelength conversion layers are provided by using two groove portions G1 and G2. However, as desired, additional groove portions and wavelength conversion layers may be further provided.

The first and second groove portions G1 and G2 adopted in this embodiment are formed on the upper surface of the first lead terminal 102a on which the LED chip 105 is mounted.

Since the first and second lead terminals 102a and 102b maybe formed of a metal or an alloy having high ductility, the groove portions G1 and G2 as desired may be easily formed by a rolling process.

According to this embodiment, the LED chip 105 and the first and second lead terminals 102a and 102b are connected by the wires 106a and 106b. In this case, when the height of the wire is low, a liquid resin containing a wavelength conversion material for forming the wavelength conversion portion 108 runs down the wire, thereby having a difficulty in obtaining a desired convex shape. Accordingly, as shown in FIG. 8, a height h of the wires 106a and 106b may be greater than a maximum height H of the wavelength conversion portion 108.

The light emitting device package according to the present invention provides superior light efficiency and uniform white characteristics throughout the entirety of the light emitting device package, thereby being used as a good white light source in various applications. Hereinafter, various applications, to which the aforementioned light emitting device package is employed, are exemplified as another aspect of the present invention.

Figure 10:
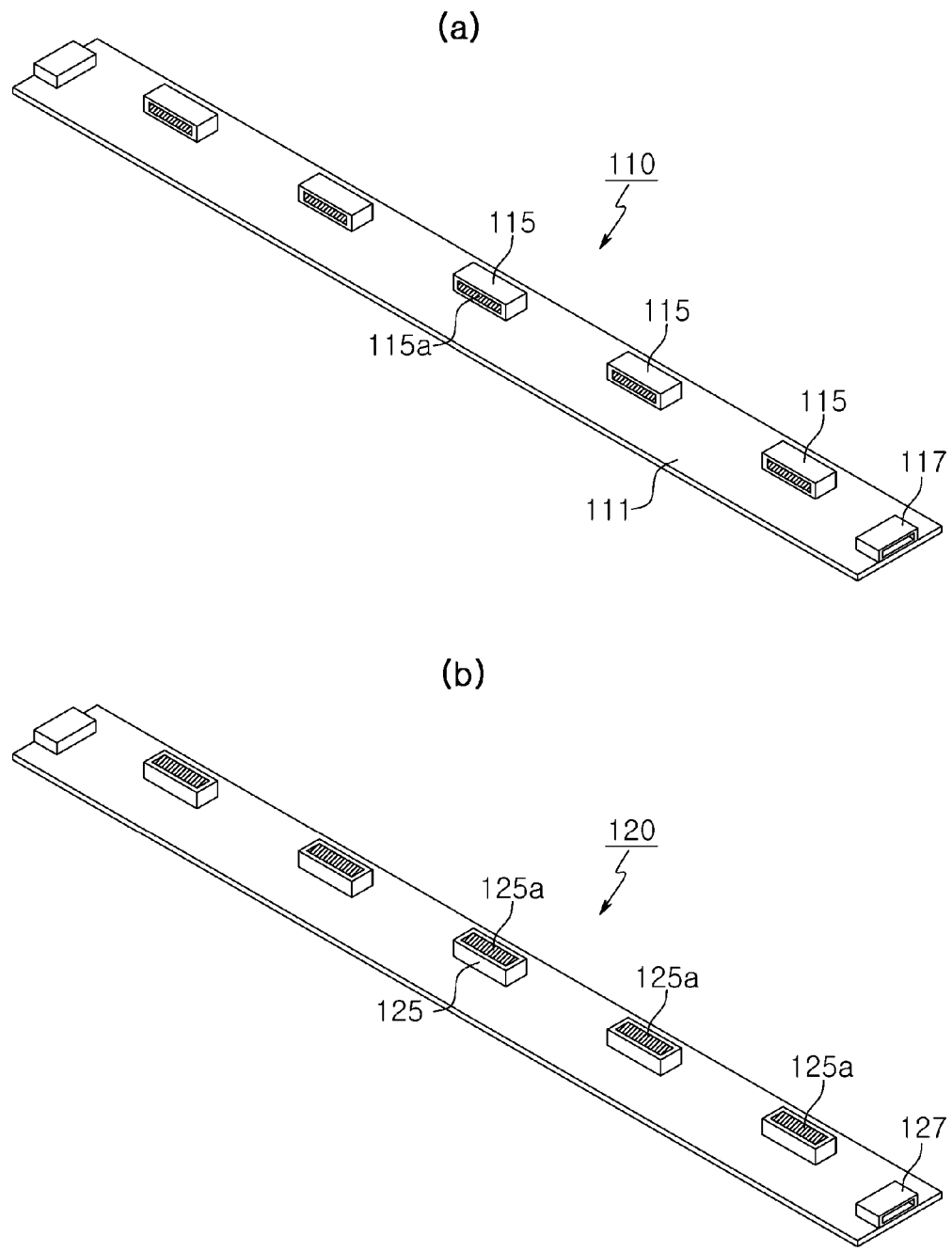
FIGS. 10A and 10B are perspective views illustrating an LED light source module according to various exemplary embodiments of the present invention.

FIGS. 10A and 10B are perspective views illustrating LED light source modules according to various exemplary embodiments of the present invention. Here, the exemplified LED light source modules may be applicable to a light source of a backlight unit (BLU) for a display as well as a variety of illumination devices.

An LED light source module 110 as shown in FIG. 10A includes a printed circuit board (PCB) 111 and a plurality of LED light sources 115 mounted on the upper surface of the PCB 111. In this embodiment, the LED light source 115 may employ the aforementioned light emitting device package.

The LED light source 115 adopted in this embodiment may be mounted on the PCB 111 such that a surface of the LED light source 115 adjacent to a light emitting surface 115a contacts the upper surface of the PCB 111. The LED light source module 110 may include a connector 117 so as to connect with external power supply circuit or another LED light source module.

Likewise, an LED light source module 120 as shown in FIG. 10B may include a PCB 121, a plurality of LED light sources 125 employing the aforementioned light emitting device package, and a connector 127. However, unlike the aforementioned embodiment, the LED light source 125 adopted in this embodiment provides the lower surface thereof opposing to a light emitting surface 125a as a mounting surface.

The aforementioned light emitting device package maybe embodied in various mounting structures and be applicable to an LED light source module providing a variety of white light forms. The aforementioned light emitting device package and the light source module including the same may be applicable to various display devices or illumination devices.

FIGS. 11A and 11B are cross-sectional views illustrating BLUs according to various exemplary embodiments of the present invention.

Figure 11:
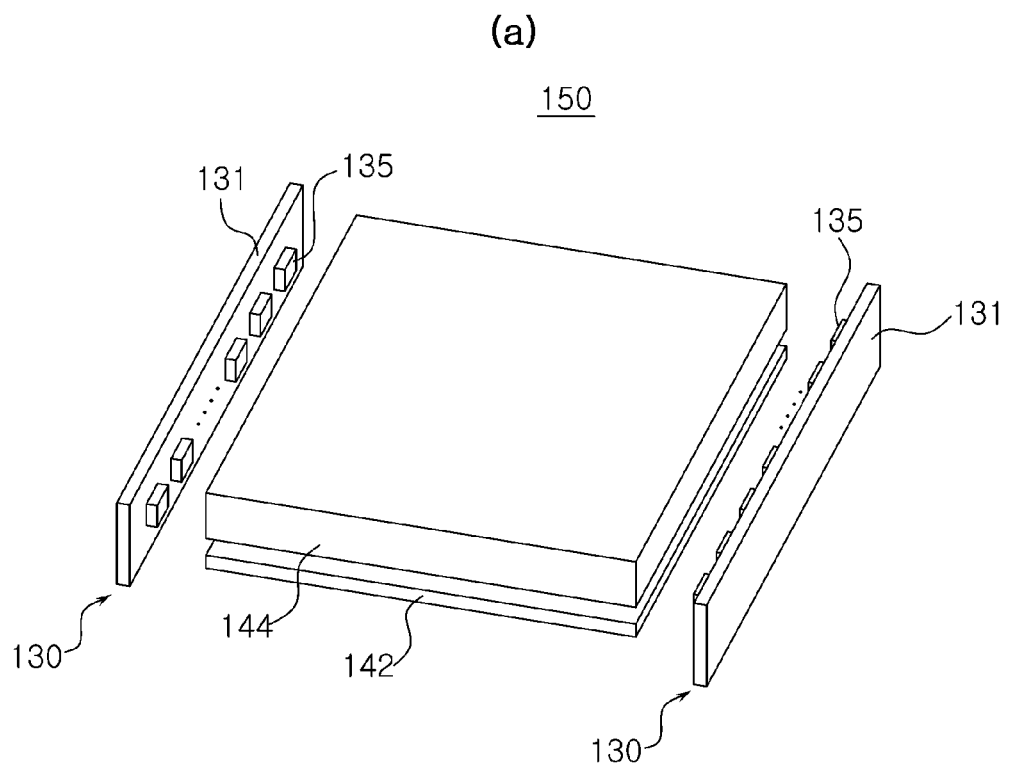
FIGS. 11A and 11B are cross-sectional views illustrating a backlight unit according to various exemplary embodiments of the present invention.
Figure 11:
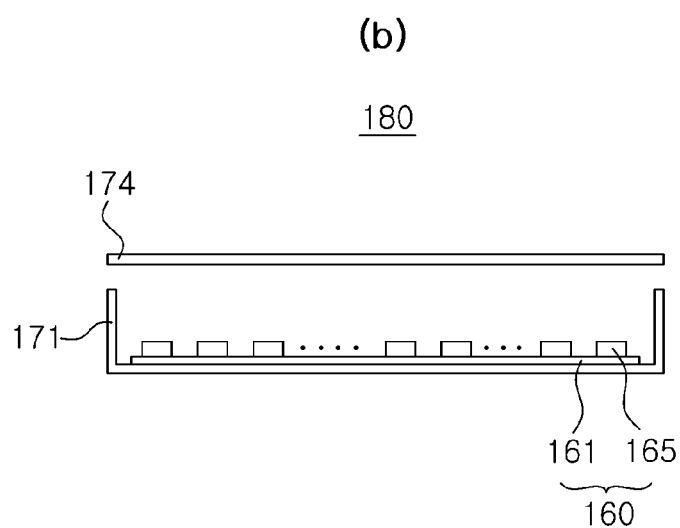

Referring to FIG. 11, an edge-type BLU 150 is shown as an example of the BLU to which the light emitting device package according to the present invention is applicable.

The edge-type BLU 150 according to this embodiment may include a light guide plate 144 and LED light source modules 130 provided at both sides of the light guide plate 144.

According to this embodiment, the LED light source modules 130 are provided at both opposing sides of the light guide plate 144. However, the LED light source module may be provided at only one side thereof or an additional LED light source module may be provided at the other side thereof.

As shown in FIG. 11A, a reflective plate 142 may be further provided under the light guide plate 144. The LED light source module 130 adopted in this embodiment may have a structure similar to that of FIG. 10B. That is, the LED light source module 130 includes a PCB 131 and a plurality of LED light sources 135 mounted on the upper surface of the PCB 131. The LED light source 135 may employ the aforementioned light emitting device package.

Referring to FIG. 11B, a direct-type BLU 180 is shown as an example of another BLU form.

The direct-type BLU 180 according to this embodiment may include a light diffusion plate 174 and an LED light source module 160 arranged under the light diffusion plate 174.

The direct-type BLU 180 as shown in FIG. 11B may include a bottom case 171 accommodating the LED light source module 160 under the light diffusion plate 174.

The LED light source module 160 adopted in this embodiment includes a PCB 161 and a plurality of LED light sources 165 mounted on the upper surface of the PCB 161. The LED light source 165 may employ the aforementioned light emitting device package.

Figure 12:
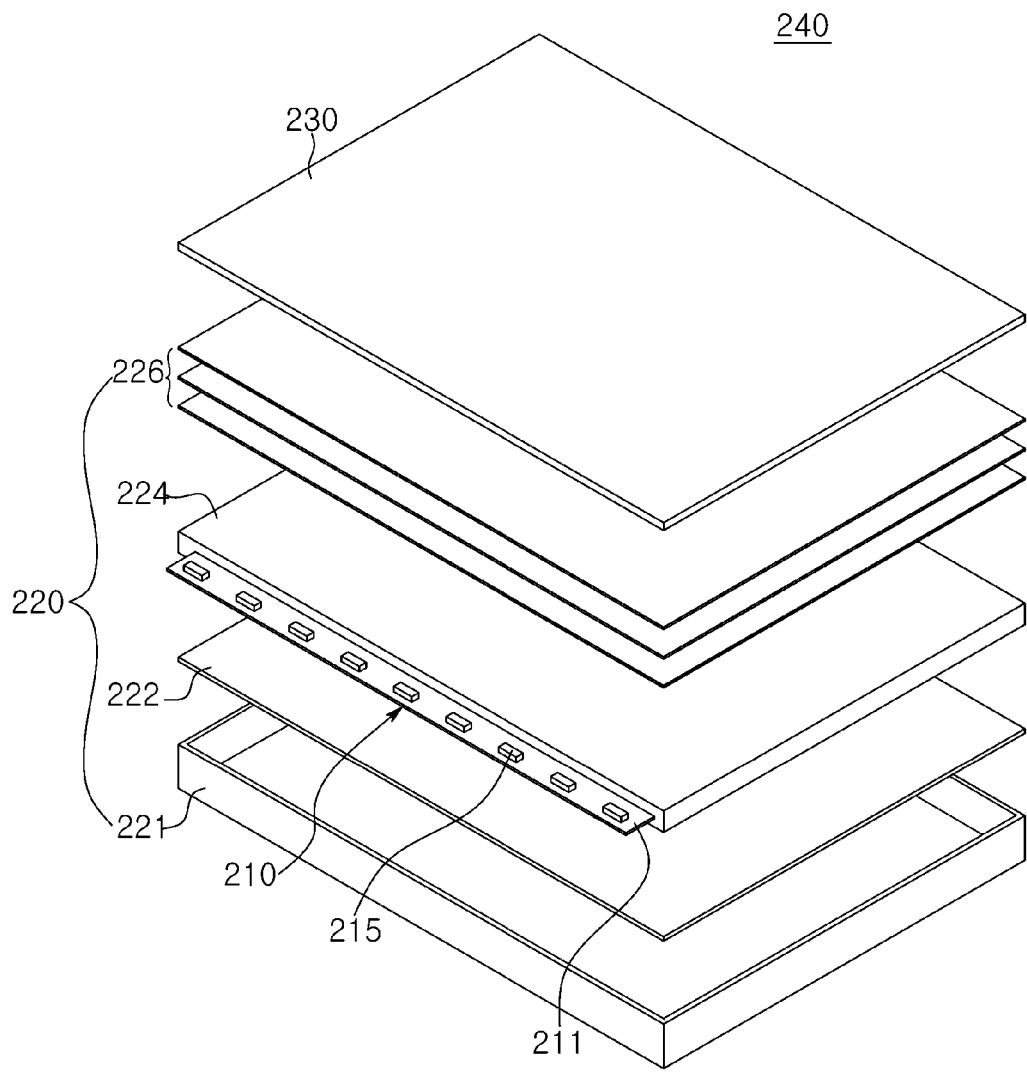
FIG. 12 is an exploded perspective view illustrating a display device according to an exemplary embodiment of the present invention.

FIG. 12 is an exploded perspective view illustrating a display device according to an exemplary embodiment of the present invention.

A display device 240 as shown in FIG. 12 includes a BLU 220 and an image display panel such as a liquid crystal panel 230. The BLU 220 includes a light guide plate 224 and an LED light source module 210 provided on at least one side of the light guide plate 224.

According to this embodiment, as shown in FIG. 12, the BLU 220 may further include a bottom case 221 and a reflective plate 222 under the light guide plate 224.

Also, according to a demand for various optical characteristics, various types of optical sheets 226 such as a diffusion sheet, a prism sheet or a protection sheet may be included between the light guide plate 224 and the liquid crystal panel 230.

The LED light source module 210 includes a PCB 211 prepared on at least one side of the light guide plate 224 and a plurality of LED light sources 215 mounted on the PCB 211 and allowing for light to be incident upon the light guide plate 224. The LED light source 215 may employ the aforementioned light emitting device package. The LED light source 215 adopted in this embodiment may be a side view type light emitting device package in which a surface thereof adjacent to a light emitting surface is mounted.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting device package comprising:
    a package body providing a chip mounting area and including first and second lead terminals;
    an LED chip mounted on the chip mounting area and electrically connected to the first and second lead terminals;
    a groove portion disposed around the LED chip in the chip mounting area; and
    a wavelength conversion portion formed of a resin containing a wavelength conversion material with which to enclose the LED chip and having an outer shape substantially defined by the groove portion, wherein the LED chip is mounted on an upper surface of one of the first and second lead terminals.

2. The light emitting device package of claim 1, wherein the groove portion has a shape corresponding to an outer shape of the LED chip.

3. The light emitting device package of claim 2, wherein the outer shape of the LED chip is polygonal, and the groove portion has a polygonal shape to enclose the LED chip.

4. The light emitting device package of claim 3, wherein the outer shape of the LED chip is quadrangular, and the groove portion has a quadrangular shape to enclose the LED chip.

5. The light emitting device package of claim 1, wherein the groove portion has a circular shape to enclose the LED chip.

6. The light emitting device package of claim 1, wherein the wavelength conversion material is a phosphor, a quantum dot or a mixture thereof.

7. The light emitting device package of claim 6, wherein the wavelength conversion material includes a mixture of at least green and red phosphors.

8. The light emitting device package of claim 7, wherein the green phosphor is $M_2SiO_4$:R, $\beta$-SiAlON or a mixture thereof and the red phosphor is $CaAlSiN_3$:R, $M_xSi_yN_{(2/3x+4/3y)}$:R, $MxSiyOzN(2/3x+4/3y-2/3z)$:R or a mixture thereof, where M is at least one selected from group II elements consisting of Mg, Ca, Sr, Ba and Zn and R is at least one selected from rare earth elements.

9. The light emitting device package of claim 6, wherein the quantum dot of the wavelength conversion material includes a semiconductor nanocrystal including a group II-VI compound such as CdS, CdSe, CdTe, ZnS, ZnSe, ZnTe, HgS, HgSe and HgTe, a semiconductor nanocrystal including a group III-V compound such as GaN, GaP, GaAs, InP and InAs, or a mixture thereof.

10. The light emitting device package of claim 6, wherein the wavelength conversion material includes a mixture of a plurality of phosphors having different light emitting colors and a red light emitting quantum dot.

11. An illumination device including the light emitting device package of claim 1.

12. The light emitting device package of claim 1, wherein the groove portion is formed in the upper surface of the lead terminal having the LED chip mounted thereon.

13. The light emitting device package of claim 1, wherein the lead terminal having the LED chip mounted thereon has a heat sink extended downwards.

14. The light emitting device package of claim 1, wherein the package body includes a ceramic substrate providing the chip mounting area, and
at least a portion of the groove portion is disposed in the ceramic substrate.

15. The light emitting device package of claim 1, wherein the groove portion has a vertical cross section in a V-shaped, U-shaped, or quadrangular form.

16. The light emitting device package of claim 1, wherein the groove portion Is formed by an imprinting or etching process.

17. The light emitting device package of claim 1, wherein an area enclosed by the groove portion is set to be nine times or less an area of the LED chip.

18. The light emitting device package of claim 1, wherein a length of a temporary straight line connecting a center of the LED chip to a point of the groove portion is set to be three times or less a length of the LED chip from the center of the LED chip to a point of an edge of the LED chip on which the straight line passes.

19. The light emitting device package of claim 1, wherein a maximum height of the wavelength conversion portion is set to be four times or less a thickness of the LED chip.

20. The light emitting device package of claim 1, further comprising, when the groove portion is defined as a first groove portion, a second groove portion disposed in the chip mounting area and uniformly spaced apart from the first groove portion while enclosing the first groove portion.

21. The light emitting device package of claim 20, further comprising, when a wavelength conversion portion disposed along the first groove portion is defined as a first wavelength conversion portion, a second wavelength conversion portion disposed above the first wavelength conversion portion and defined by the second groove portion.

22. The light emitting device package of claim 21, wherein the first and second wavelength conversion portions include different wavelength conversion materials emitting light of different wavelengths.

23. The light emitting device package of claim 22, wherein the wavelength conversion material of the first wavelength conversion portion produces light having a wavelength shorter than that of light produced by the wavelength conversion material of the second wavelength conversion portion.

24. The light emitting device package of claim 1, wherein the LED chip is connected to at least one of the first and second lead terminals by a wire, and a height of the wire is greater than a maximum height of a resin package portion.

25. The light emitting device package of claim 1, wherein the package body includes a sidewall structure enclosing the chip mounting area.

26. An LED light source module including the light emitting device package of claim 1.

27. A backlight unit including the light emitting device package of claim 1.

28. A display device comprising:
a panel for displaying an image; and
the backlight unit of claim 27, the backlight unit providing light to the panel.

* * * * *